(12) United States Patent
Chen et al.

(10) Patent No.: US 7,268,559 B1
(45) Date of Patent: Sep. 11, 2007

(54) INTELLIGENT LIFE TESTING METHODS AND APPARATUS FOR LEAKAGE CURRENT PROTECTION

(75) Inventors: Wusheng Chen, Yueqing Zhejiang (CN); Fu Wang, Yueqing Zhejiang (CN); Lianyun Wang, Yueqing Zhejiang (CN)

(73) Assignee: General Protecht Group, Inc., Yueqing (CN)

( * ) Notice: Subject to any disclaimer, the term of this patent is extended or adjusted under 35 U.S.C. 154(b) by 0 days.

(21) Appl. No.: 11/588,046

(22) Filed: Oct. 26, 2006

(30) Foreign Application Priority Data

Dec. 26, 2005 (CN) .................. 2005 1 0132772

(51) Int. Cl.
G01R 31/08 (2006.01)
(52) U.S. Cl. .................. 324/527; 324/509; 361/45
(58) Field of Classification Search .................. None
See application file for complete search history.

(56) References Cited

U.S. PATENT DOCUMENTS

| | | | |
|---|---|---|---|
| 4,931,894 A | 6/1990 | Legatti | |
| 4,979,070 A | 12/1990 | Bodkin | |
| 5,053,931 A | 10/1991 | Rushing | |
| 5,223,810 A | 6/1993 | Van Haaren | |
| 5,229,730 A | 7/1993 | Legatti et al. | |
| 5,334,939 A | 8/1994 | Yarbrough | |
| 5,363,269 A | 11/1994 | McDonald | |
| 5,418,678 A | 5/1995 | McDonald | |
| 5,448,443 A | 9/1995 | Muelleman | |
| 5,477,412 A | 12/1995 | Neiger et al. | |
| 5,541,800 A | 7/1996 | Misencik | |
| 5,642,248 A | 6/1997 | Campolo et al. | |
| 5,654,857 A | 8/1997 | Gershen | |
| 5,661,623 A | 8/1997 | McDonald et al. | |
| 5,673,360 A | 9/1997 | Scripps | |
| 5,684,272 A | 11/1997 | Gernhardt et al. | |
| 5,706,155 A | 1/1998 | Neiger et al. | |
| 5,729,417 A | 3/1998 | Neiger et al. | |
| 5,757,598 A | 5/1998 | Aromin | |
| 5,786,971 A | 7/1998 | Chan et al. | |
| 5,825,599 A | 10/1998 | Rosenbaum | |
| 5,841,615 A | 11/1998 | Gershen | |
| 5,899,761 A | 5/1999 | Crane et al. | |
| 5,906,517 A | 5/1999 | Crane et al. | |
| 5,963,406 A | 10/1999 | Neiger et al. | |
| 5,963,408 A | 10/1999 | Neiger et al. | |
| 6,021,034 A | 2/2000 | Chan et al. | |

(Continued)

*Primary Examiner*—Vincent Q. Nguyen
(74) *Attorney, Agent, or Firm*—Morris Manning & Martin LLP; Tim Tingkang Xia, Esq.

(57) ABSTRACT

An apparatus for testing the life of a leakage current protection device having a leakage current detection circuit. In one embodiment, the apparatus a trip mechanism state generator, a fault alarm generator, a ground fault simulation unit. In operation, the ground fault simulation unit generates a simulated ground fault signal during every positive half-wave of an AC power, the simulated ground fault signal is detected by the leakage current detection circuit, the leakage current detection circuit responsively generates a signal to turn a switching device into its conductive state so as to allow a current to pass therethrough, the passed current is converted into a DC voltage in accordance with a trip mechanism state generated by the trip mechanism state generator, the fault alarm circuit receives and analyzes the DC voltage and indicates whether a fault exists in the leakage current protection device.

25 Claims, 4 Drawing Sheets

U.S. PATENT DOCUMENTS

| | | |
|---|---|---|
| 6,040,967 A | 3/2000 | DiSalvo |
| 6,052,265 A | 4/2000 | Zaretsky et al. |
| 6,052,266 A | 4/2000 | Aromin |
| 6,128,169 A | 10/2000 | Neiger et al. |
| 6,226,161 B1 | 5/2001 | Neiger et al. |
| 6,246,558 B1 | 6/2001 | DiSalvo et al. |
| 6,252,407 B1 | 6/2001 | Gershen |
| 6,259,340 B1 | 7/2001 | Fuhr et al. |
| 6,262,871 B1 | 7/2001 | Nemir et al. |
| 6,282,070 B1 | 8/2001 | Ziegler et al. |
| 6,292,337 B1 | 9/2001 | Legatti et al. |
| 6,339,525 B1 | 1/2002 | Neiger et al. |
| 6,381,112 B1 | 4/2002 | DiSalvo |
| 6,381,113 B1 | 4/2002 | Legatti |
| 6,407,469 B1 | 6/2002 | Cline et al. |
| 6,407,893 B1 | 6/2002 | Neiger et al. |
| 6,433,555 B1 | 8/2002 | Leopold et al. |
| 6,437,700 B1 | 8/2002 | Herzfeld et al. |
| 6,437,953 B2 | 8/2002 | DiSalvo et al. |
| 6,437,955 B1 | 8/2002 | Duffy et al. |
| 6,442,007 B1 | 8/2002 | Li |
| 6,465,735 B2 | 10/2002 | May |
| 6,515,564 B2 | 2/2003 | Leopold et al. |
| 6,532,139 B2 | 3/2003 | Kim et al. |
| 6,538,862 B1 | 3/2003 | Mason, Jr. et al. |
| 6,540,533 B1 | 4/2003 | Schreiber |
| 6,577,478 B2 | 6/2003 | Kim et al. |
| 6,611,406 B2 | 8/2003 | Neiger et al. |
| 6,643,108 B2 | 11/2003 | Cline et al. |
| 6,646,838 B2 | 11/2003 | Ziegler et al. |
| 6,657,834 B2 | 12/2003 | DiSalvo |
| 6,671,145 B2 | 12/2003 | Germain et al. |
| 6,674,289 B2 * | 1/2004 | Macbeth .................... 324/509 |
| 6,697,238 B2 | 2/2004 | Bonilla et al. |
| 6,724,589 B1 | 4/2004 | Funderburk |
| 6,734,680 B1 | 5/2004 | Conard |
| 6,734,769 B1 | 5/2004 | Germain et al. |
| 6,747,367 B2 | 6/2004 | Cline et al. |
| 6,771,152 B2 | 8/2004 | Germain et al. |
| 6,788,504 B2 | 9/2004 | Vanderkolk |
| 6,813,126 B2 | 11/2004 | DiSalvo et al. |
| 6,828,886 B2 | 12/2004 | Germain et al. |
| 6,850,394 B2 | 2/2005 | Kim |
| 6,859,044 B2 | 2/2005 | Hughes |
| 6,864,766 B2 | 3/2005 | DiSalvo et al. |
| 6,867,954 B2 | 3/2005 | Wu et al. |
| 6,873,231 B2 | 3/2005 | Germain et al. |
| 6,897,381 B2 | 5/2005 | He et al. |
| 6,915,992 B1 | 7/2005 | Gretz |
| 6,944,001 B2 | 9/2005 | Ziegler et al. |
| 6,946,935 B2 | 9/2005 | Wu et al. |
| 6,949,994 B2 | 9/2005 | Germain et al. |
| 6,949,995 B2 | 9/2005 | Leopold et al. |
| 6,954,125 B2 | 10/2005 | Wu et al. |
| 6,958,463 B1 | 10/2005 | Kochman et al. |
| 6,963,260 B2 | 11/2005 | Germain et al. |
| 6,972,572 B2 | 12/2005 | Mernyk et al. |
| 6,975,492 B2 | 12/2005 | DiSalvo |
| 6,982,856 B2 | 1/2006 | Bernstein |
| 6,991,495 B1 | 1/2006 | Aromin |
| 2006/0198066 A1 | 9/2006 | Chen et al. |

* cited by examiner

INTELLIGENT LIFE TESTING METHODS AND APPARATUS FOR LEAKAGE CURRENT PROTECTION

CROSS-REFERENCE TO RELATED APPLICATION

This application claims priority of Chinese Patent Application No. 2005 1073 2772.1, filed on Dec. 26, 2005, entitled "Intelligent Life Testing Methods and Apparatus for Leakage Current Protection" by Wusheng CHEN, Fu WANG, and Lianyun WANG, the disclosure of which is incorporated herein by reference in its entirety.

This application is related to four co-pending U.S. patent applications, entitled "Intelligent Life Testing Methods and Apparatus for Leakage Current Protection Device with Indicating Means," by Feng ZHANG, Honigliang CHEN, Fu WANG, Wusheng CHEN, Yulin ZHANG and Huaiyin SONG; "Apparatus and Methods for Testing the Life of a Leakage Current Protection Device," by Feng ZHANG, Hongliang CHEN, Fu WANG, Wusheng CHEN, Yulin ZHANG and Huaiyin SONG; "Intelligent Life Testing Methods and Apparatus for Leakage Current Protection," by Feng ZHANG, Hongliang CHEN, Fu WANG, Wusheng CHEN, Yulin ZHANG and Huaiyin SONG; and "Intelligent Life Testing Methods and Apparatus for Leakage Current Protection," by Feng ZHANG, Hongliang CHEN, Fu WANG, Wusheng CHEN, Yulin ZHANG and Huaiyin SONG, respectively. The above identified co-pending applications were filed on the same day that this application was filed, and with the same assignee as that of this application. The disclosures of the above identified co-pending applications are incorporated herein by reference in their entireties.

FIELD OF THE PRESENT INVENTION

The present invention generally relates to a leakage current protection device, and more particularly, to an apparatus and methods for intelligently testing the life of a leakage current protection device.

BACKGROUND OF THE PRESENT INVENTION

Leakage current protection can be divided into two categories according to their functionalities: ground fault circuit interrupter (hereinafter "GFCI") and arc fault circuit interrupter (hereinafter "AFCI"). In order to achieve the goal of leakage current protection, a leakage current protection device used for appliances comprises at least two components: a trip mechanism and a leakage current detection circuit. The trip mechanism comprises a silicon controlled rectifier (hereinafter "SCR"), trip coil, and trip circuit interrupter device. The leakage current detection circuit comprises induction coils, a signal amplifier and a controller.

The operating principle of a GFCI used for appliances is as follows. In a normal condition, the electric current on a hot wire of an electrical socket should be the same as the electric current on a neutral wire in the same electrical socket. When a leakage current occurs, there exists a current differential between the hot wire and the neutral wire of the electrical socket. The inductive coil of the leakage current protection device monitors the current differential and transfers the current differential into a voltage signal. The voltage signal is then amplified by the signal amplifier and sent to the controller. If the current differential exceeds a predetermined threshold, the controller sends a control signal to the trip circuit interrupter to cut off the connection between the AC power and the appliance to prevent damage caused by the leakage current.

For an AFCI used for appliances, in a normal condition, the electric current on a hot wire of an electrical socket should be the same as the electric current on a neutral wire in the same electrical socket, and the variation of both the electric current is same. When an arc fault occurs due to aging or damages of the AFCI device, the current or voltage between the hot wire and the neutral wire of the electrical socket exhibits a series of repeated pulse signals. The inductive coil of the arc fault protection device detects the pulse signals and converts the pulse signals to a voltage signal. The voltage signal is amplified by the signal amplifier and sent to the controller. If the amplitude of the pulse signals or the their occurring frequency exceed certain predetermined threshold, the controller sends a control signal to the trip circuit interrupter to cut off the connection between the AC power and the appliance to prevent further damage caused by the arc fault.

Leakage current protection devices have been widespreadly used because of their superior performance. However, the leakage protection devices may fail to provide such leakage current protection, if they are installed improperly and/or they are damaged due to aging. If a faulty controller can not output a correct control signal, or a trip mechanism fails to cut off the connection between the AC power and the appliance, the leakage current protection device will not be able to provide the leakage current protection, which may cause further damages or accidents. Although most leakage current protection devices are equipped with a manual testing button, usually, users seldom use the manual testing button. Therefore, the leakage current protection devices need an additional circuit to automatically detect malfunctions, faults or the end of the life of such devices. The great relevance would be gained if a leakage current protection device is capable of automatically detecting a fault therein or its end of the life, and consequently alerting a user to take an appropriate action including repairing or replacing the leakage current detection circuit.

Therefore, a heretofore unaddressed need exists in the art to address the aforementioned deficiencies and inadequacies.

SUMMARY OF THE PRESENT INVENTION

In one aspect, the present invention relates to an apparatus for testing the life of a leakage current protection device. The leakage current protection device has a first inductive coil N1, a second inductive coil N2, a first input, a second input, a first output electrically coupled to the second input through the first inductive coil N1 and the second inductive coil N2, a second output, a third output, a trip switch SW101 having two LINE terminals and electrically coupled to the first input and the second input, respectively, for receiving an AC power, and two LOAD terminals and electrically coupled to the inputs of an electrical appliance, respectively, a power supply circuit having an input electrically coupled to the first input, and an output electrically coupled to the second output, a trip coil circuit having a switching device VD1 having a gate, an anode and a cathode, an input, an output electrically coupled to the third output, and a leakage current detection circuit having an output electrically coupled to the input of the trip coil circuit, and a power supply input, electrically coupled to the output of the power supply circuit and the second output.

In one embodiment, the apparatus includes a trip mechanism state generator having a first input electrically coupled to the third output of the leakage current protection device, a second input electrically coupled to the first input of the leakage current protection device, a third input electrically coupled to the second input of the leakage current protection device, a first output and a second output. The trip mechanism state generator is adapted for generating a trip mechanism state at the first output and the second output, where the trip mechanism state has a first state and a second state. When the trip mechanism state is in the first state, there is no fault exist in the leakage current protection device. When the trip mechanism state is in the second state, there is at least one fault exists in the leakage current protection device.

In one embodiment, the trip mechanism state generator has: a first diode D1 having a cathode and an anode electrically coupled to the second input of the trip mechanism state generator; a second diode D2 having a cathode electrically coupled to the cathode of the first diode D1 and the first input of the trip mechanism state generator, and an anode electrically coupled to the third input of the trip mechanism state generator; a third diode D3 having an anode and a cathode electrically coupled to the second input of the leakage current protection device and the anode of the second diode D2; a fourth diode D4 having a cathode electrically coupled to the anode of the first diode D1 and the first input of the leakage current protection device, and an anode electrically coupled to a first output of the trip mechanism state generator; a fifth resistor R5 having a first terminal electrically coupled to the first output of the trip mechanism state generator, and a second terminal electrically coupled to the second output; and a sixth resistor R6 having a first terminal electrically coupled to the second terminal of the fifth resistor R5 and the second output of the trip mechanism state generator, and a second terminal electrically coupled to the anode of the third diode D3.

The apparatus also includes a fault alarm generator having a first input electrically coupled to the first output of the trip mechanism state generator, a second input electrically coupled to the second output of the trip mechanism state generator, and a power supply input electrically coupled to the second output of the leakage current protection device.

In one embodiment, the fault alarm circuit has a multi-vibrator having a light emitting diode (LED) D8. The multi-vibrator generates no vibration indicating that there is no fault in the leakage current protection device when the fault alarm circuit receives a negative DC voltage, while the multi-vibrator generates vibrations and a visible alarm through the LED D8 indicating that there is at least one fault in the leakage current protection device when the fault alarm circuit receives a positive DC voltage. In one embodiment, the fault alarm circuit comprises an audio alarm circuit for generating an audible alarm.

The apparatus further includes a ground fault simulation unit having an input electrically coupled to the first input of the leakage current protection device, and an output electrically coupled to the first output of the leakage current protection device.

In one embodiment, the ground fault simulation unit has: a first resistor R1 having a first terminal and a second terminal; a second resistor R2 having a first terminal and a second terminal; a third resistor R3 having a first terminal and a second terminal; a seventh diode D7 having a cathode and an anode, wherein the anode of the seventh diode D7 is connected to the input that is electrically coupled a hot wire of the AC power, and the cathode of the seventh diode D7 is connected to both the first terminal of the resistor R1 and the first terminal of the second resistor R2; a first transistor Q1 having a first collector electrically coupled to the second terminal of the first resistor R1, a first emitter electrically coupled to both the second terminal of the third resistor R3 and the output, and a first base; and a sixth zener diode D6 having an anode electrically coupled to the base of the first transistor Q1, and a cathode electrically coupled to both the second terminal of the second resistor R2 and the first terminal of the third resistor R3.

In another embodiment, the ground fault simulation unit has: a first resistor R1 having a first terminal and a second terminal; a second resistor R2 having a first terminal and a second terminal; a third resistor R3 having a first terminal and a second terminal electrically coupled to the second output2; a seventh diode D7 having an anode electrically coupled to the input of the ground fault simulation unit, and a cathode electrically coupled to both the first terminal of the first resistor R1 and the first terminal of the second resistor R2; a first transistor Q1 having a first collector electrically coupled to the second terminal of the first resistor R1, a first emitter electrically coupled to the second input of the leakage current protection device, and a base; and a sixth zener diode D6 having an anode electrically coupled to the base of the first transistor Q1, and a cathode electrically coupled to both the second terminal of the second resistor R2 and the first terminal of the third resistor R3.

In yet another embodiment, the ground fault simulation unit has: a first resistor R1 having a first terminal and a second terminal; a seventh diode D7 having an anode electrically coupled to the input, and a cathode electrically coupled to the first terminal of the resistor R1; and a transformer T1 having a primary winding having a first primary terminal P1 and a second primary terminal P2, and a secondary winding having a first secondary terminal S1 and a second secondary terminal S2, wherein the first primary terminal P1 is electrically coupled to the second terminal of the first resistor R1, the second primary terminal P2 is electrically coupled to the second input of the leakage current protection device, the first secondary terminal S1 is electrically coupled to the second secondary terminal S2 through the first inductive coil N1 and the second inductive coil N2.

In an alternative embodiment, the ground fault simulation unit has: a seventh diode D7 having a cathode and an anode electrically coupled to the input; and a first resistor R1 having a first terminal electrically coupled to the cathode of the seventh diode D7, and a second terminal electrically coupled to the output.

In yet an alternative embodiment, the ground fault simulation unit has: a first resistor R1 having a first terminal and second terminal; a seventh diode D7 having an anode electrically coupled to the input, and a cathode electrically coupled to the first terminal of the first resistor R1; and a sixth zener diode D6 having a cathode electrically coupled to the second terminal of the first resistor R1, and an anode electrically coupled to the output.

In operation, the ground fault simulation unit generates a simulated ground fault signal during every positive half-wave of the AC power, the simulated ground fault signal is detected by the leakage current detection circuit, the leakage current detection circuit responsively generates a signal to turn the switching device VD1 into its conductive state so as to allow a current to pass therethrough, the passed current is converted into a DC voltage in accordance with a trip mechanism state generated by the trip mechanism state generator, the fault alarm circuit receives and analyzes the DC voltage and indicates whether a fault exists in the leakage current protection device. In one embodiment, the DC voltage is detected at the first terminal and the second terminal of the resistor R5 of the trip mechanism state generator. The DC voltage is a negative voltage if there is no fault in the leakage current protection device, and wherein the DC voltage is a positive voltage if there is at least one fault in the leakage current protection device.

In another aspect, the present invention relates to a method for intelligently testing the life of a leakage current protection device. The leakage current protection device has a first inductive coil N1, a second inductive coil N2, a first input, a second input, a first output electrically coupled to the second input through the first inductive coil N1 and the second inductive coil N2, a second output, a third output, a trip switch SW101 having two LINE terminals and electrically coupled to the first input and the second input, respectively, for receiving an AC power, and two LOAD terminals and electrically coupled to the inputs of an electrical appliance, respectively, a power supply circuit having an input electrically coupled to the first input, and an output electrically coupled to the second output, a trip coil circuit having a switching device VD1 having a gate, an anode and a cathode, an input, an output electrically coupled to the third output, and a leakage current detection circuit having an output electrically coupled to the input of the trip coil circuit, and a power supply inputp electrically coupled to the output of the power supply circuit and the second output.

In one embodiment, the method includes the step of providing a testing device having a trip mechanism state generator having a first input electrically coupled to the third output of the leakage current protection device, a second input electrically coupled to the first input of the leakage current protection device, a third input electrically coupled to the second input of the leakage current protection device, a first output and a second output, wherein the trip mechanism state generator is adapted for generating a trip mechanism state at the first output and the second output, wherein the trip mechanism state has a first state and a second state; a fault alarm generator having a first input electrically coupled to the first output of the trip mechanism state generator, a second input electrically coupled to the second output of the trip mechanism state generator, and a power supply input electrically coupled to the second output of the leakage current protection device; and a ground fault simulation unit having an input electrically coupled to the first input of the leakage current protection device, and an output electrically coupled to the first output of the leakage current protection device.

The method further includes the steps of generating a simulated ground fault signal during every positive half-wave of the AC power by the ground fault simulation unit; detecting the simulated ground fault signal at the leakage current detection circuit; generating a signal to turn the switching device VD1 into its conductive state so as to allow a current to pass therethrough; generating a DC voltage in responsive to a trip mechanism state at the trip mechanism state generator, wherein the trip mechanism state is in a first state that there is no fault exist in the leakage current protection device, or in a second state that there is at least one fault exists in the leakage current protection device; receiving the DC voltage at the fault alarm circuit; and indicating whether at least one fault exists in the leakage current protection device. In one embodiment, the indicating step includes the step of producing a visible alarm and/or an audible alarm.

In yet another aspect, the present invention relates to an apparatus for life testing. In one embodiment, the apparatus has a leakage current protection device having a first inductive coil N1, a second inductive coil N2, a first input, a second input, a first output electrically coupled to the second input through the first inductive coil N1 and the second inductive coil N2, a second output, a third output, a trip switch SW101 having two LINE terminals and electrically coupled to the first input and the second input, respectively, for receiving an AC power, and two LOAD terminals and electrically coupled to the inputs of an electrical appliance, respectively, a power supply circuit having an input electrically coupled to the first input, and an output electrically coupled to the second output, a trip coil circuit having a switching device VD1 having a gate, an anode and a cathode, an input, an output electrically coupled to the third output, and a leakage current detection circuit having an output electrically coupled to the input of the trip coil circuit, and a power supply inputp electrically coupled to the output of the power supply circuit and the second output Furthermore, the apparatus includes a trip mechanism state generator having a first input electrically coupled to the third output of the leakage current protection device, a second input electrically coupled to the first input of the leakage current protection device, a third input electrically coupled to the second input of the leakage current protection device, a first output and a second output. The trip mechanism state generator is adapted for generating a trip mechanism state at the first output and the second output, where the trip mechanism state has a first state and a second state. When the trip mechanism state is in the first state, there is no fault exist in the leakage current protection device. When the trip mechanism state is in the second state, there is at least one fault exists in the leakage current protection device.

Moreover, the apparatus also includes a fault alarm generator having a first input electrically coupled to the first output of the trip mechanism state generator, a second input electrically coupled to the second output of the trip mechanism state generator, and a power supply input electrically coupled to the second output of the leakage current protection device.

Additionally, the apparatus further includes a ground fault simulation unit having an input electrically coupled to the first input of the leakage current protection device, and an output electrically coupled to the first output of the leakage current protection device.

In operation, the ground fault simulation unit generates a simulated ground fault signal during every positive half-wave of the AC power, the simulated ground fault signal is detected by the leakage current detection circuit, the leakage current detection circuit responsively generates a signal to turn the switching device VD1 into its conductive state so as to allow a current to pass therethrough, the passed current is converted into a DC voltage in accordance with a trip mechanism state generated by the trip mechanism state generator, the fault alarm circuit receives and analyzes the DC voltage and indicates whether a fault exists in the leakage current protection device.

In one embodiment, the trip mechanism state generator has: a first diode D1 having a cathode and an anode electrically coupled to the second input of the trip mechanism state generator; a second diode D2 having a cathode electrically coupled to the cathode of the first diode D1 and the first input of the trip mechanism state generator, and an anode electrically coupled to the third input of the trip mechanism state generator; a third diode D3 having an anode and a cathode electrically coupled to the second input of the leakage current protection device and the anode of the second diode D2; a fourth diode D4 having a cathode electrically coupled to the anode of the first diode D1 and the first input of the leakage current protection device, and an anode electrically coupled to a first output of the trip mechanism state generator; a fifth resistor R5 having a first terminal electrically coupled to the first output of the trip mechanism state generator, and a second terminal electrically coupled to the second output; and a sixth resistor R6 having a first terminal electrically coupled to the second terminal of the fifth resistor R5 and the second output of the trip mechanism state generator, and a second terminal electrically coupled to the anode of the third diode D3. In one embodiment, the DC voltage is detected at the first terminal and the second terminal of the resistor R5. The DC voltage is a negative voltage if there is no fault in the leakage current protection device, and wherein the DC voltage is a positive voltage if there is at least one fault in the leakage current protection device.

In one embodiment, the fault alarm circuit has a multi-vibrator having a light emitting diode (LED) D8. The multi-vibrator generates no vibration indicating that there is no fault in the leakage current protection device when the fault alarm circuit receives a negative DC voltage, while the multi-vibrator generates vibrations and a visible alarm through the LED D8 indicating that there is at least one fault in the leakage current protection device when the fault alarm circuit receives a positive DC voltage. In one embodiment, the fault alarm circuit comprises an audio alarm circuit for generating an audible alarm.

In one embodiment, the ground fault simulation unit has: a first resistor R1 having a first terminal and a second terminal; a second resistor R2 having a first terminal and a second terminal; a third resistor R3 having a first terminal and a second terminal; a seventh diode D7 having a cathode and an anode, wherein the anode of the seventh diode D7 is connected to the input that is electrically coupled a hot wire of the AC power, and the cathode of the seventh diode D7 is connected to both the first terminal of the resistor R1 and the first terminal of the second resistor R2; a first transistor Q1 having a first collector electrically coupled to the second terminal of the first resistor R1, a first emitter electrically coupled to both the second terminal of the third resistor R3 and the output, and a first base; and a sixth zener diode D6 having an anode electrically coupled to the base of the first transistor Q1, and a cathode electrically coupled to both the second terminal of the second resistor R2 and the first terminal of the third resistor R3.

In another embodiment, the ground fault simulation unit has: a first resistor R1 having a first terminal and a second terminal; a second resistor R2 having a first terminal and a second terminal; a third resistor R3 having a first terminal and a second terminal electrically coupled to the second output2; a seventh diode D7 having an anode electrically coupled to the input of the ground fault simulation unit, and a cathode electrically coupled to both the first terminal of the first resistor R1 and the first terminal of the second resistor R2; a first transistor Q1 having a first collector electrically coupled to the second terminal of the first resistor R1, a first emitter electrically coupled to the second input of the leakage current protection device, and a base; and a sixth zener diode D6 having an anode electrically coupled to the base of the first transistor Q1, and a cathode electrically coupled to both the second terminal of the second resistor R2 and the first terminal of the third resistor R3.

In yet another embodiment, the ground fault simulation unit has: a first resistor R1 having a first terminal and a second terminal; a seventh diode D7 having an anode electrically coupled to the input, and a cathode electrically coupled to the first terminal of the resistor R1; and a transformer T1 having a primary winding having a first primary terminal P1 and a second primary terminal P2, and a secondary winding having a first secondary terminal S1 and a second secondary terminal S2, wherein the first primary terminal P1 is electrically coupled to the second terminal of the first resistor R1, the second primary terminal P2 is electrically coupled to the second input of the leakage current protection device, the first secondary terminal S1 is electrically coupled to the second secondary terminal S2 through the first inductive coil N1 and the second inductive coil N2.

In an alternative embodiment, the ground fault simulation unit has: a seventh diode D7 having a cathode and an anode electrically coupled to the input; and a first resistor R1 having a first terminal electrically coupled to the cathode of the seventh diode D7, and a second terminal electrically coupled to the output.

In yet an alternative embodiment, the ground fault simulation unit has: a first resistor R1 having a first terminal and second terminal; a seventh diode D7 having an anode electrically coupled to the input, and a cathode electrically coupled to the first terminal of the first resistor R1; and a sixth zener diode D6 having a cathode electrically coupled to the second terminal of the first resistor R1, and an anode electrically coupled to the output.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE PRESENT INVENTION

Figure 1:
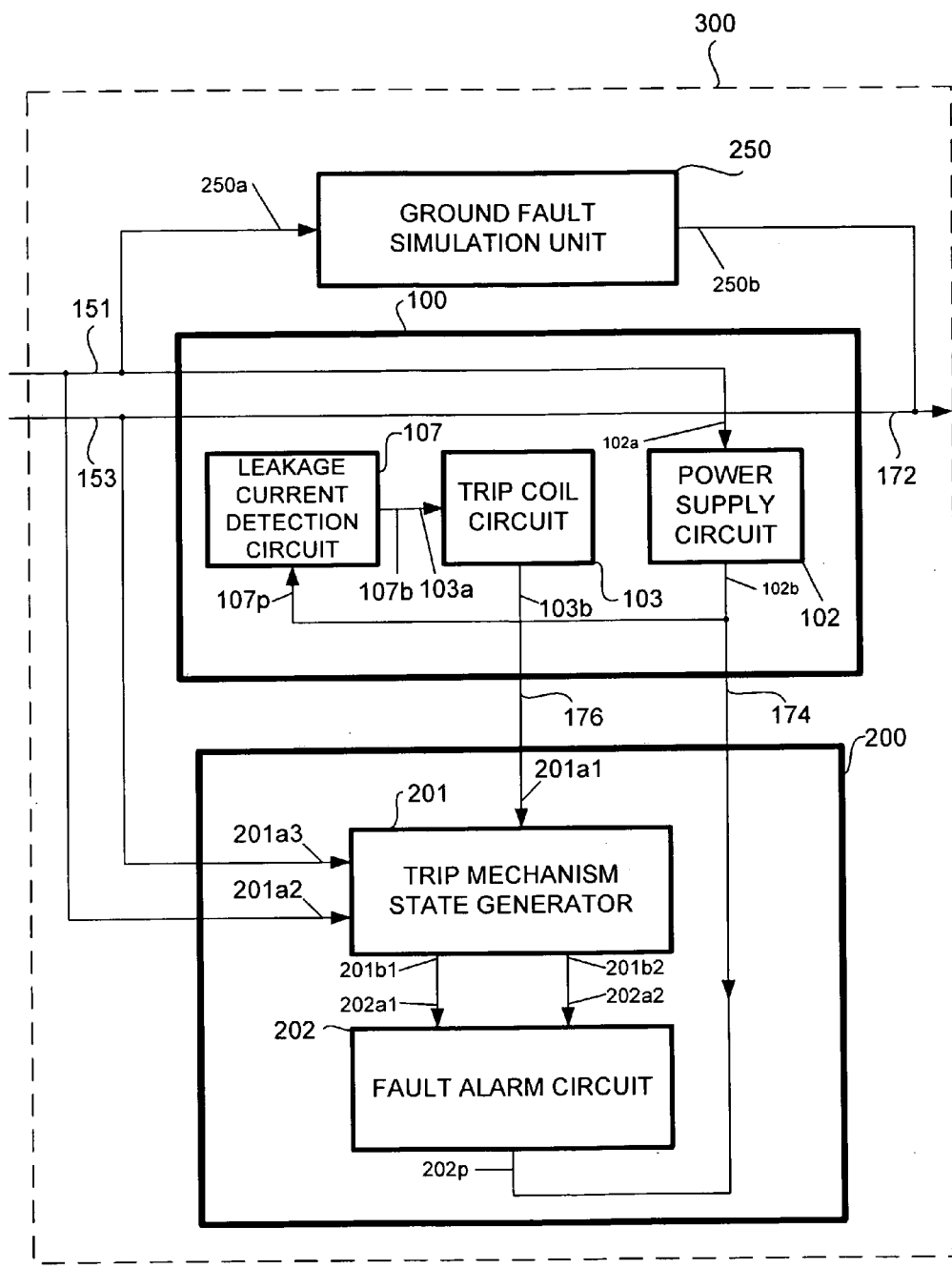
FIG. 1 shows a block diagram of an apparatus for intelligently testing the life of a leakage current protection device according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. Whether or not a term is capitalized is not considered definitive or limiting of the meaning of a term. As used in the description herein and throughout the claims that follow, a capitalized term shall have the same meaning as an uncapitalized term, unless the context of the usage specifically indicates that a more restrictive meaning for the capitalized term is intended. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "unit" and "circuit" are interchangeable, and refer to a configuration of electrically or electromagnetically electrically coupled components or devices.

The term "switch" or "switching device", refers to a device for changing the course (or flow) of a circuit, i.e., a device for making or breaking an electric circuit, or for selecting between multiple circuits. As used herein, a switch or switching device has two states: a conductive state and a non-conductive state. When the switching device is in the conductive state, a current is allowed to pass through. When the switching device is in the non-conductive state, no current is allowed to pass through.

As used herein, short names, acronyms and/or abbreviations "AC" refers to alternate current; "DC" refers to direct current; "AFCI" refers to arc fault circuit interrupter; "GFCI" refers to ground fault circuit interrupter; "LED" refers to light emitting diode; "MCU" refers to microcontroller unit; and "SCR" refers to silicon controlled rectifier.

EMBODIMENTS OF THE INVENTION

The description will be made as to the embodiments of the present invention in conjunction with the accompanying drawings in FIGS. 1-4. In accordance with the purposes of this invention, as embodied and broadly described herein, this invention, in one aspect, relates to apparatus for intelligently testing the life of a leakage current protection device.

Figure 2:
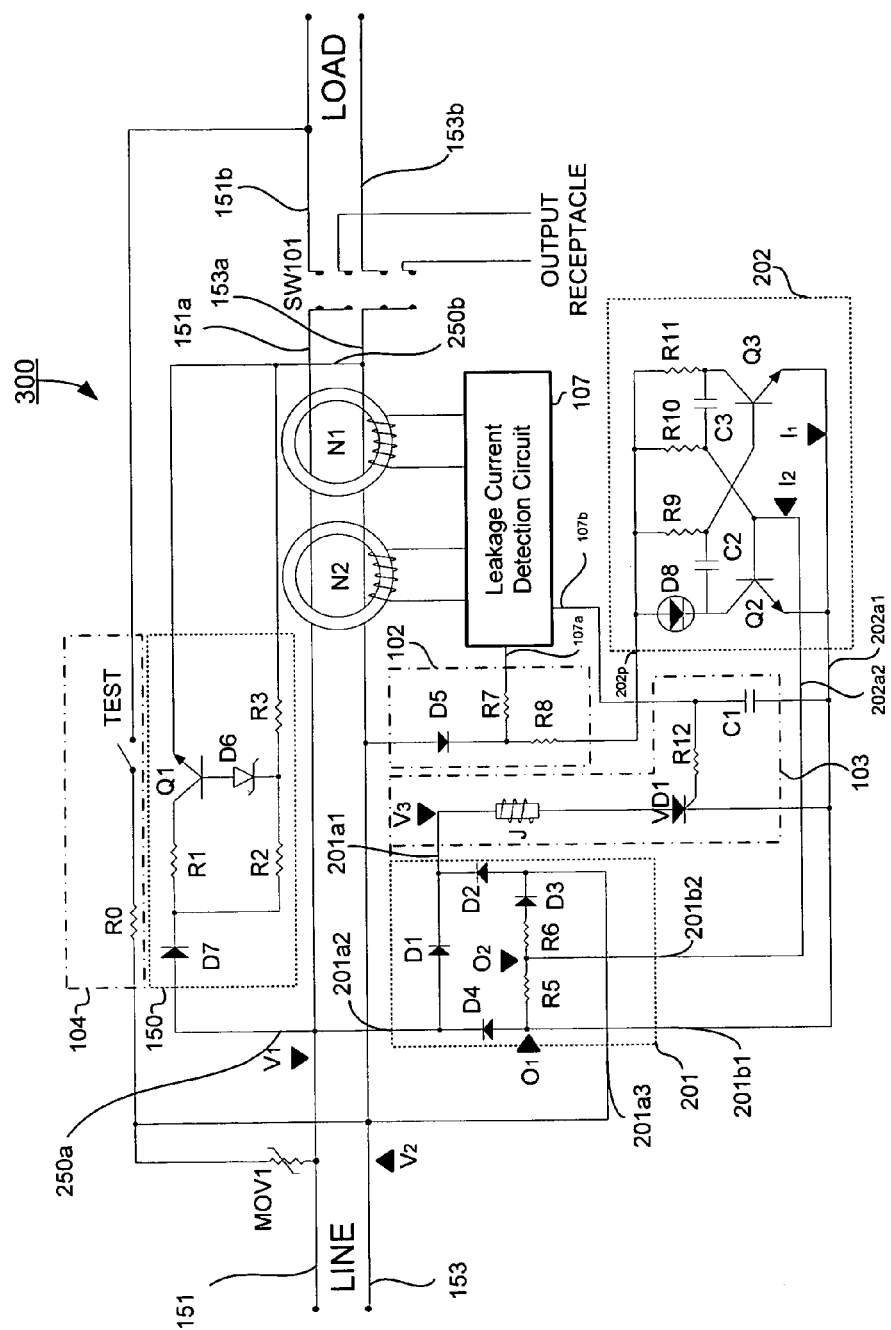
FIG. 2 shows a circuit diagram of an apparatus for intelligently testing the life of a leakage current protection device according to one embodiment of the present invention.

Referring to FIGS. 1-4, and particularly to FIGS. 1 and 2 first, an apparatus 300 for intelligently testing the life of a leakage current protection device, according to embodiments of the present invention, has a leakage current protection device 100, a ground fault simulation unit 250 and an intelligent life testing and alarm circuit 200.

The leakage current protection device 100 has a first input 151, a second input 153, a first output 172, a second output 174, a third output 176. The leakage current protection device 100 further has a power supply circuit 102 having an input 102a electrically coupled to the first input 151, and an output 102b electrically coupled to the second output 174. Moreover, the leakage current protection device 100 has a trip coil circuit 103 having an input 103a, an output 103b electrically coupled to the third output 176. Additionally, the leakage current protection device 100 has a leakage current detection circuit 107 having an output 107b electrically coupled to the input 103a of the trip coil circuit 103, and a power supply input 107p electrically coupled to the output 102b of the power supply circuit 102 and the second output 174. The leakage current protection device 100 also has a trip switch SW101, a manual testing circuit 104 and a metal oxide varistors (MOV) MOV1. Furthermore, the leakage current protection device 100 has a first inductive coil N1 and a second inductive coil N2 coupled with the line phase and neutral wires of an AC power for detecting leakage current.

The trip switch SW101 has two LINE terminals 151a and 153a that are electrically coupled to the first input 151 and the second input 153, through the first inductive coil N1 and the second inductive coil N2, respectively, and two LOAD terminals 151b and 153b electrically connected to one or more electric appliances. The first input 151 and the second input 153 are electrically connected to an incoming AC power. When the trip switch SW101 is in a conductive state, the AC power is connected from the LINE terminals 151a and 153a to the LOAD terminals 151b and 153b. When the SW101 is in a non-conductive state, the AC power to the LOAD terminals 151b and 153b is disconnected from the LINE terminals 151a and 153a. The LOAD terminals 151b and 153b may be also connected to an outlet receptacle.

The two inductive coils N1 and N2 are adapted for detecting leakage current. When a current passing through a first input 151 to the LOAD terminal 151b of the trip switch SW101 is substantially different from a current passing through the second input 153 for the LOAD terminal 153b, the inductive coils N1 and N2 detect the difference and a leakage current is consequently sent to the leakage current detection circuit 107.

When the leakage current detection circuit 107 receives the leakage current from the inductive coils N1 and N2, and it compares the leakage current with a predetermined threshold. If the leakage current is greater than the predetermined threshold, a ground fault exists, then the leakage current detection circuit 107 sends a signal to the trip coil circuit 103 to disconnect the AC power from the LINE terminals 151a and 153a to the LOAD terminals 151b and 153b. The leakage current detection circuit 107 is a part of leakage current protection device 100 and known to those skilled in the art.

The half-wave power supply circuit 102 has a fifth diode D5 having an anode and a cathode and a seventh current limiting resistor R7 having a first and second terminals and an eighth current limiting resistor R8 having a first and second terminals. The anode of the fifth diode D5 is electrically connected to the second input 153 that is connected the one of the line phase and neutral wires of the AC power, and the cathode of the fifth diode D5 is electrically connected to both the first terminals of the resistor R7 and the resistor R8. The second terminal of the resistor R7 is electrically connected to the input 107a of the leakage current detection circuit 107. For such a configuration, the current at the cathode of the fifth diode D5 is direct current. The current limiting resistors are used to convert the current into a voltage and reduce it at the output. The power supply 102 is connected through the second terminal of the seventh resistor R7 to the leakage current detection circuit 107. The power supply 102 is also connected through the second terminal of the eighth resistor R8 to a fault alarm circuit 202.

The trip coil circuit 103 includes a switching device VD1 having a gate, an anode and a cathode, a first capacitor C1 having a first and second terminals, a twelfth resistor R12, and a trip coil J electrically connected between the trip mechanism state generator 201 and the anode of the switching device VD1. The cathode of the switching device VD1 is electrically connected to the fault alarm circuit 202. The twelfth resistor R12 is electrically connected between the gate of the switching device VD1 and the output 107b of the leakage current detection circuit 107. The first capacitor C1 has its first terminal connected to the output 107b of the leakage current detection circuit 107 and its second terminal connected to the fault alarm circuit 202, as shown in FIG. 2. An input signal to the gate of the switching device VD1 from the output 107b of the leakage current detection circuit 107 through the twelfth resistor R12 makes the switching device VD1 either in a conductive or a non-conductive state. When the switching device VD1 is in the conductive state, the trip coil J is connected to the power supply and the trip coil sets the trip switch SW101 into a non-conductive state (a trip state).

The manual testing circuit 104 has a resistor R0 and a push-on release-off switch TEST that are connected in series. The manual testing circuit 104 is electrically connected between the MOV1 and the LOAD terminal 151b of the trip switch SW101 and adapted for manually testing the leakage current protection device 100.

The trip switch SW101 maintains its state until a current passes through the trip coil J. The trip switch SW101 responds to the action of the trip coil J. When the leakage current detection circuit 107 detects the leakage current, a signal from the leakage current detection circuit is sent to the gate of the switching device VD1, which sets the switching device VD1 to its conductive state. The power supply 102 energizes the trip coil J to set the trip switch SW101 in its non-conductive state so that the AC power is disconnected from the LINE terminals 151a and 153a to the LOAD terminals 151b and 153b, i.e. in a trip state. If the leakage current protection device 100 does not have an automatic reset circuit, the leakage current protection device in a trip state can be manually reset by pressing a reset button.

As shown in FIG. 1, the apparatus 300 includes a trip mechanism state generator 201 having a first input 201a1 electrically coupled to the third output 176 of the leakage current protection device 100, a second input 201a2 electrically coupled to the first input 151 of the leakage current protection device 100, a third input 201a3 electrically coupled to the second input 153 of the leakage current protection device 100, a first output 201b1 and a second output 201b2. The trip mechanism state generator 201 is adapted for generating a trip mechanism state at the first output 201b1 and the second output 201b2, where the trip mechanism state has a first state and a second state. When the trip mechanism state is in the first state, there is no fault exist in the leakage current protection device 100. When the trip mechanism state is in the second state, there is at least one fault exists in the leakage current protection device 100.

As shown in FIG. 2, the trip mechanism state generator 201 has a first diode D1 having a cathode and an anode electrically coupled to the second input 201a2 of the trip mechanism state generator 201; a second diode D2 having a cathode electrically coupled to both the cathode of the first diode D1 and the first input 201a1 of the trip mechanism state generator 201, and an anode electrically coupled to the third input 201a3 of the trip mechanism state generator 201; a third diode D3 having an anode and a cathode electrically coupled to both the second input 153 of the leakage current protection device 100 and the anode of the second diode D2; a fourth diode D4 having a cathode electrically coupled to both the anode of the first diode D1 and the first input 151 of the leakage current protection device 100, and an anode electrically coupled to a first output 201b1 of the trip mechanism state generator 201; a fifth resistor R5 having a first terminal electrically coupled to the first output 201b1 of the trip mechanism state generator 201, and a second terminal electrically coupled to the second output 201b2; and a sixth resistor R6 having a first terminal electrically coupled to the second terminal of the fifth resistor R5 and the second output 201b2 of the trip mechanism state generator 201, and a second terminal electrically coupled to the anode of the third diode D3.

The trip mechanism state generator 201 generates two distinct states: one indicating that the trip mechanism of the leakage current protection device 100 is working properly, and the other indicating that the trip mechanism of the leakage current protection device 100 is out of order. The trip mechanism state generator 201 is an asymmetric bridge rectifying circuit. The bridge rectifying circuit provides a first current path and a second current path. In one embodiment, the first path starts from a first wire of an AC power (for example, through the first input 151 of the leakage current protection device 100), going through the first diode D1, the trip coil J, the switching device VD1 of the trip coil circuit 103, the fifth resistor R5, the sixth resistor R6, the third diode D3 and returning to the second wire of the AC power (for example, through the second input 153 of the leakage current protection device 100). The second path starts from the second wire of the AC power, going through the second diode D2, the trip coil J, the switching device VD1 of the trip coil circuit 103, the fourth diode D4 and returning to the first wire of the AC power. The first wire of the AC power can be one of a hot wire and a neutral wire, whole the second wire of the AC power is chosen to be the other of a hot wire and a neutral wire.

The apparatus 300 also includes a fault alarm generator 202 having a first input 202a1 electrically coupled to the first output 201b1 of the trip mechanism state generator 201, a second input 202a2 electrically coupled to the second output 201b2 of the trip mechanism state generator 201, and a power supply input 202p electrically coupled to the second output 172 of the leakage current protection device 100, as shown in FIG. 1.

As shown in FIG. 2, the fault alarm circuit 202 comprises a light emitting diode (LED) D8, a second transistor Q2, a third transistor Q3, a second capacitor C2, a third capacitor C3, a ninth resistor R9, a tenth resistor R10 and a eleventh resistor R11. The fault alarm circuit 202 is a multi-vibrator. The input to the fault alarm circuit 202 is the voltage between the base of the second transistor Q2 and the emitters of the second and the third transistors Q2 and Q3. These two terminals are connected to both ends of the fifth resistor R5 of the trip mechanism state generator 201. When the voltage is greater than a predetermined level, a vibration is started in the fault alarm circuit 202 and the LED D8 starts to flash, indicating at least one fault exists in the trip mechanism of the leakage current protection device. When the voltage is less than the predetermined level, the multi-vibrator will not vibrate in the fault alarm circuit 202 and the LED D8 remains dark, indicating no fault exists in the trip mechanism of the leakage current protection device. In one embodiment, the predetermined level of the voltage can be set to zero. Therefore, when the fault alarm circuit 202 receives a negative DC voltage, the multi-vibrator generates no vibration indicating that there is no fault in the leakage current protection device 100. When the fault alarm circuit 202 receives a positive DC voltage, the multi-vibrator generates vibrations and a visible alarm through the LED D8 indicating that there is at least one fault in the leakage current protection device 100. The fault alarm circuit 202 may include an audio alarm circuit for generating an audible alarm.

In one embodiment, the DC voltage is detected at the first terminal and the second terminal of the resistor R5 of the trip mechanism state generator 201.

Furthermore, the apparatus 300 further includes a ground fault simulation unit 250 having an input 250a electrically coupled to the first input 151 of the leakage current protection device 100, and an output 250b electrically coupled to the first output 172 of the leakage current protection device 100, as shown in FIG. 1.

As shown in FIG. 2, the ground fault simulation unit 250 has a first resistor R1 having a first terminal and a second terminal; a second resistor R2 having a first terminal and a second terminal; a third resistor R3 having a first terminal and a second terminal; a seventh diode D7 having a cathode and an anode, wherein the anode of the seventh diode D7 is connected to the input 250a that is electrically coupled to a first wire of an AC power through the first input 151 of the leakage current protection device 100, and the cathode of the seventh diode D7 is connected to both the first terminal of the resistor R1 and the first terminal of the second resistor R2; a first transistor Q1 having a first collector electrically coupled to the second terminal of the first resistor R1, a first emitter electrically coupled to both the second terminal of the third resistor R3 and the output terminal 250b, and a first base; and a sixth zener diode D6 having an anode electrically coupled to the base of the first transistor Q1, and a cathode electrically coupled to both the second terminal of the second resistor R2 and the first terminal of the third resistor R3.

This output terminal 250b of the ground fault simulation unit 250 is connected to a second wire of the AC power after the second wire (the first input terminal 153 of the leakage current protection device 100, for example) passes the first and the second inductive coils N1 and N2. During a positive half-wave of the AC power, the first transistor Q1 is in a non-conductive state at first. As the input voltage increases, the first transistor Q1 remains in its non-conductive state until the input voltage is greater than the voltage difference between the collector terminal and the emitter terminal of the first transistor Q1. At this point the first transistor Q1 becomes conductive. After the input voltage reaches its peak and the first transistor Q1 remains conductive until the input voltage is less than the voltage difference between the collector terminal and the emitter terminal of the first transistor Q1. At this point the first transistor Q1 becomes non-conductive. The first transistor Q1 remains non-conductive until the input voltage is greater than the voltage difference between the collector terminal and the emitter terminal of the first transistor Q1 during the next positive half-wave of the AC power. A square wave signal is formed at the output of the ground fault simulation unit 250 as a simulated ground fault signal.

Figure 3:
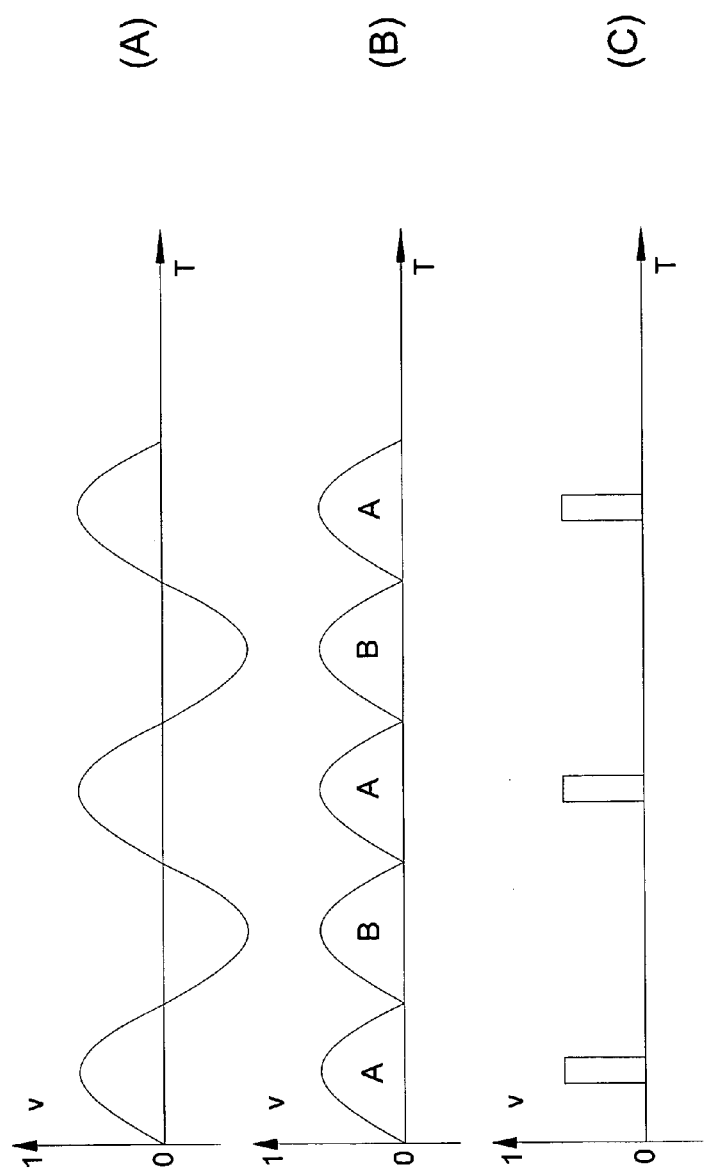
FIG. 3 shows (A) an AC power signal waveform; (B) a waveform measured at a first end of the trip coil J, point V3 shown in FIG. 2, and (C) the waveform of a simulated ground fault current according to embodiments of the present invention.

Referring now to FIG. 3, three signal waveforms are presented according to one embodiment of the present invention. FIG. 3A is a signal wave form of the AC power input shown in full cycle measured at the input of the ground fault simulation unit 250 marked as V1. FIG. 3B shows the signal wave form measured at an output of an asymmetric bridge rectifier circuit marked as $V_3$. FIG. 3C is the square wave signal measured at the output of the ground fault simulation unit 250. The shape of the square wave can be adjusted by varying the parameter of the ground fault simulation unit 250.

Figure 4:
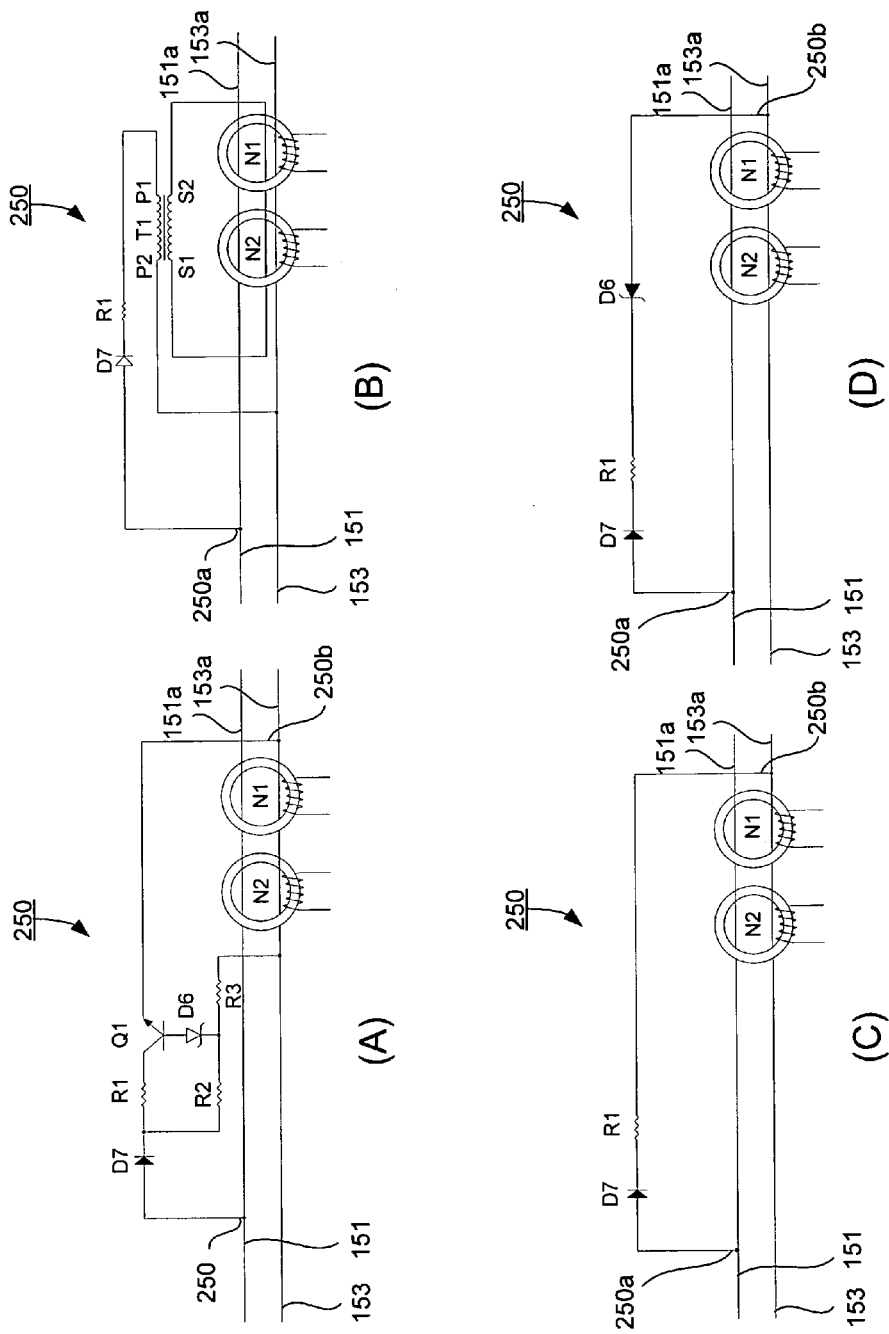
FIG. 4 shows four different embodiments (A)-(D) of a ground fault simulation unit according to embodiments of the present invention.

FIG. 4 also shows alternative embodiments of the ground fault simulation unit 250. As shown in FIG. 3A, the ground fault simulation unit 250 has a first resistor R1 having a first terminal and a second terminal; a second resistor R2 having a first terminal and a second terminal; a third resistor R3 having a first terminal and a second terminal electrically coupled to the second output 250b2; a seventh diode D7 having an anode electrically coupled to the input 250a of the ground fault simulation unit 250, and a cathode electrically coupled to both the first terminal of the first resistor R1 and the first terminal of the second resistor R2; a first transistor Q1 having a first collector electrically coupled to the second terminal of the first resistor R1, a first emitter electrically coupled to the second input 153 of the leakage current protection device 100, and a base; and a sixth zener diode D6 having an anode electrically coupled to the base of the first transistor Q1, and a cathode electrically coupled to both the second terminal of the second resistor R2 and the first terminal of the third resistor R3. The input 205a of the ground fault simulation unit 250 is electrically connected to a first wire of the AC power, while the output 250b of the ground fault simulation unit 250 is electrically connected to a second wire of the AC passed the first inductive coil N1 and the second inductive coil N2.

As shown in FIG. 4B, the ground fault simulation unit 250 has: a first resistor R1 having a first terminal and a second terminal; a seventh diode D7 having an anode electrically coupled to the input 250a, and a cathode electrically coupled to the first terminal of the resistor R1; and a transformer T1 having a primary winding having a first primary terminal P1 and a second primary terminal P2, and a secondary winding having a first secondary terminal S1 and a second secondary terminal S2, wherein the first primary terminal P1 is electrically coupled to the second terminal of the first resistor R1, the second primary terminal P2 is electrically coupled to the second input 153 of the leakage current protection device 100, the first secondary terminal S1 is electrically coupled to the second secondary terminal S2 through the first inductive coil N1 and the second inductive coil N2.

As shown in FIG. 4C, the ground fault simulation unit 250 has a seventh diode D7 having a cathode and an anode electrically coupled to the input 250a; and a first resistor R1 having a first terminal electrically coupled to the cathode of the seventh diode D7, and a second terminal electrically coupled to the output 250b. The input 205a of the ground fault simulation unit 250 is electrically connected to a first wire of the AC power, while the output 250b of the ground fault simulation unit 250 is electrically connected to a second wire of the AC passed the first inductive coil N1 and the second inductive coil N2.

As shown in FIG. 4D, the ground fault simulation unit 250 has a first resistor R1 having a first terminal and second terminal; a seventh diode D7 having an anode electrically coupled to the input 250a, and a cathode electrically coupled to the first terminal of the first resistor R1; and a sixth zener diode D6 having a cathode electrically coupled to the second terminal of the first resistor R1, and an anode electrically coupled to the output 250b. The input 205a of the ground fault simulation unit 250 is electrically connected to a first wire of the AC power, while the output 250b of the ground fault simulation unit 250 is electrically connected to a second wire of the AC passed the first inductive coil N1 and the second inductive coil N2.

In operation, the ground fault simulation unit 250 generates a simulated ground fault signal during every positive half-wave of the AC power, the simulated ground fault signal is detected by the leakage current detection circuit 107, the leakage current detection circuit 107 responsively generates a signal to turn the switching device VD1 into its conductive state so as to allow a current to pass therethrough, the passed current is converted into a DC voltage in accordance with a trip mechanism state generated by the trip mechanism state generator 201, the fault alarm circuit 202 receives and analyzes the DC voltage and indicates whether a fault exists in the leakage current protection device 100.

Specifically, referring to FIG. 2, the ground fault simulation unit 250 generates a simulated ground fault during every positive half-wave of an AC power. The current after the seventh diode D7 is connected to a voltage divider having the second resistor R2 and the third resistor R3 to the second wire of the AC power. The ratio of the voltage divider is determined by the values of these two resistors R2 and R3. During the positive half-wave of the AC power, the voltage across R2 increases until the voltage exceeds the relative consistent voltage maintained at the sixth zener diode D6 and the sixth zener diode D6 becomes conductive. Then the first transistor Q1 becomes conductive as a result of the sixth zener diode D6 becoming conductive. After the AC power reaches its peak, the input voltage of the AC power starts to decrease. The voltage at the cathode of the seventh diode D7 reaches a point where the sixth zener diode D6 becomes non-conductive. The first transistor Q1 becomes non-conductive as a result, thus forming the square wave simulated ground fault signal as shown in FIG. 2C. This process repeats every positive half-wave. An approximated square wave or other non-square wave signals can also be used for simulating ground faults.

The simulated ground fault signal is detected by two inductive coils N1 and N2 and sent to a leakage current detection circuit 107 for processing. The output of the leakage current detection circuit 107 is fed to a trip coil circuit 103. The trip coil circuit 103 comprises a twelfth resistor R12, a silicon controlled rectifier VD1, a coil J for the trip mechanism. The simulated ground fault signal enables the leakage current detection circuit 107 to output a signal to turn the SCR VD1 into conductive state. During this time, a trip mechanism state generator 201 generates a state related to the status of the trip mechanism. The trip mechanism state generator 201 comprises a first diode D1, a second diode D2, a third diode D3, a fourth diode D4, a fifth resistor R5 and a sixth resistor R6. These components form an asymmetric rectifying bridge providing current through the trip coil circuit 103.

During positive half-wave of the AC power, a first path of current is formed from a first wire of the AC power to the second wire of the AC power through the first diode D1, the trip coil J, the VD1, the fifth resistor R5, the sixth resistor R6 and the third diode D3. The values of the resistors R5 and R6 are selected so that the current passing through the first path of current is small enough not to trip the trip mechanism. During negative half-wave of the AC power, a second path of current is formed from the second wire of the AC power to the first wire of the AC power through the second diode D2, the trip coil J, the VD1, and the fourth diode D4. When the inductive coils N1 and N2, an IC inside the leakage current detection circuit, the SCR VD1 are working properly, the current through the first path generates a negative voltage across the fifth resistor R5, i.e. the voltage at the point marked as O2 is lower than the voltage at the point marked as O1. This negative voltage indicates the proper working order of the leakage current protection device. Otherwise, if the leakage current detection circuit 107 fails to detect the simulated ground fault, if the trip coil J is broken so the current could not pass through the first path, or if the VD1 fails to respond to the signal from the leakage current detection circuit 107, a current can not pass through the first path and the negative voltage can not be established across the fifth resistor R5. Therefore, the negative voltage across the fifth resistor R5, marked as O1 and O2, reflects the status of the leakage current protection device.

The both terminals of the fifth resistor R5, marked as O1 and O2, are connected to two input terminals of a fault alarm circuit 202. The fault alarm circuit 202 comprises a second transistor Q2, a third transistor Q3, a light emitting diode (LED) D8, a second capacitor C2, a third capacitor C3, a ninth resistor R9, a tenth resistor R10 and a eleventh resistor R11. The fault alarm circuit 202 is a multi-vibrator. When the voltage between the two input terminals (the voltage across the fifth resistor R5) is negative, the second transistor Q2 is in non-conductive state and the LED D8 is not lit. If the voltage between the two input terminals is not negative, the multi-vibrator vibrates and the LED D8 flashes. The frequency of the LED D8 flashing depends on the parameters of the components used in the multi-vibrator. The flashing frequency can be chosen from any numbers of flashes per second as long as the flashing can be identified by human eyes. In one embodiment, the flashing rate is one flash per second. The flashing rate can be lower than one flash per second, and also can be higher that one flash per second. Optionally, additional audio alarm circuit can be added to the fault alarm circuit 202.

Another aspect of the present invention provides a method of intelligently testing the life of a leakage current protection device having a leakage current detection circuit and a trip mechanism. In one embodiment, the method comprises the steps of:

detecting fault in leakage current protection device with a fault detector; and alerting user of the leakage current protection device with a life testing detection unit having an fault alarm circuit when at least one fault is detected in the leakage current protection device.

The step of detecting fault in leakage current protection device with a fault detector comprising the step of detecting fault in a leakage current detection circuit of the leakage current protection device with the fault detector having (i) a trip mechanism state generator, (ii) a ground fault simulation unit, and (iii) a fault alarm circuit having a multivibrator.

The step of alerting user of the leakage current protection device when at least one fault is detected in the leakage current protection device comprises the step of alerting user of the leakage current protection device by producing a visible visual alarm.

The step of detecting fault in leakage current protection device with the fault detector comprising the steps of:

producing a simulated ground fault by the ground fault simulation unit during positive half-wave of an AC power;

generating a trip mechanism state by the trip mechanism state generator;

detecting the trip mechanism state; and determining whether at least one fault exists in the trip mechanism of the leakage current protection device.

If no fault exists in the leakage current detection circuit of the leakage current detection device, the trip mechanism state disables the vibration of the multivibrator of the fault alarm circuit. If at least one fault exists in the leakage current detection circuit of the leakage current protection device, the trip mechanism state enables the vibration of the multivibrator of the fault alarm circuit.

In another embodiment, the method for intelligently testing the life of a leakage current protection device includes the steps of providing a life testing device as disclosed above; generating a simulated ground fault signal during every positive half-wave of the AC power by the ground fault simulation unit; detecting the simulated ground fault signal at the leakage current detection circuit; generating a signal to turn the switching device VD1 into its conductive state so as to allow a current to pass therethrough; generating a DC voltage in responsive to a trip mechanism state at the trip mechanism state generator, wherein the trip mechanism state is in a first state that there is no fault exist in the leakage current protection device, or in a second state that there is at least one fault exists in the leakage current protection device; receiving the DC voltage at the fault alarm circuit; and indicating whether at least one fault exists in the leakage current protection device. In one embodiment, the indicating step includes the step of producing a visible alarm and/or an audible alarm.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An apparatus for testing the life of a leakage current protection device, wherein the leakage current protection device has a first inductive coil N1, a second inductive coil N2, a first input, a second input, a first output electrically coupled to the second input through the first inductive coil N1 and the second inductive coil N2, a second output, a third output, a trip switch SW101 having two LINE terminals and electrically coupled to the first input and the second input, respectively, for receiving an AC power, and two LOAD terminals and electrically coupled to the inputs of an electrical appliance, respectively, a power supply circuit having an input electrically coupled to the first input, and an output electrically coupled to the second output, a trip coil circuit having a switching device VD1 having a gate, an anode and a cathode, an input, an output electrically coupled to the third output, and a leakage current detection circuit having an output electrically coupled to the input of the trip coil circuit, and a power supply inputp electrically coupled to the output of the power supply circuit and the second output, comprising:

(i) a trip mechanism state generator having a first input electrically coupled to the third output of the leakage current protection device, a second input electrically coupled to the first input of the leakage current protection device, a third input electrically coupled to the second input of the leakage current protection device, a first output and a second output, wherein the trip mechanism state generator is adapted for generating a trip mechanism state at the first output and the second output, wherein the trip mechanism state has a first state and a second state, and wherein when the trip mechanism state is in the first state, there is no fault exist in the leakage current protection device, and wherein the trip mechanism state is in the second state, there is at least one fault exists in the leakage current protection device;

(ii) a fault alarm generator having a first input electrically coupled to the first output of the trip mechanism state generator, a second input electrically coupled to the second output of the trip mechanism state generator, and a power supply input electrically coupled to the second output of the leakage current protection device; and (iii) a ground fault simulation unit having an input electrically coupled to the first input of the leakage current protection device, and an output electrically coupled to the first output of the leakage current protection device, wherein, in operation, the ground fault simulation unit generates a simulated ground fault signal during every positive half-wave of the AC power, the simulated ground fault signal is detected by the leakage current detection circuit, the leakage current detection circuit responsively generates a signal to turn the switching device VD1 into its conductive state so as to allow a current to pass therethrough, the passed current is converted into a DC voltage in accordance with a trip mechanism state generated by the trip mechanism state generator, the fault alarm circuit receives and analyzes the DC voltage and indicates whether a fault exists in the leakage current protection device.

2. The apparatus of claim 1, wherein the trip mechanism state generator comprises:
(i) a first diode D1 having a cathode and an anode electrically coupled to the second input of the trip mechanism state generator;
(ii) a second diode D2 having a cathode electrically coupled to the cathode of the first diode D1 and the first input of the trip mechanism state generator, and an anode electrically coupled to the third input of the trip mechanism state generator;
(iii) a third diode D3 having an anode and a cathode electrically coupled to the second input of the leakage current protection device and the anode of the second diode D2;
(iv) a fourth diode D4 having a cathode electrically coupled to the anode of the first diode D1 and the first input of the leakage current protection device, and an anode electrically coupled to a first output of the trip mechanism state generator;
(v) a fifth resistor R5 having a first terminal electrically coupled to the first output of the trip mechanism state generator, and a second terminal electrically coupled to the second output; and
(vi) a sixth resistor R6 having a first terminal electrically coupled to the second terminal of the fifth resistor R5 and the second output of the trip mechanism state generator, and a second terminal electrically coupled to the anode of the third diode D3.

3. The apparatus of claim 2, the DC voltage is detected at the first terminal and the second terminal of the resistor R5.

4. The apparatus of claim 3, wherein the DC voltage is a negative voltage if there is no fault in the leakage current protection device, and wherein the DC voltage is a positive voltage if there is at least one fault in the leakage current protection device.

5. The apparatus of claim 4, wherein the fault alarm circuit comprises a multi-vibrator having a light emitting diode (LED) D8, wherein the multi-vibrator generates no vibration indicating that there is no fault in the leakage current protection device when the fault alarm circuit receives a negative DC voltage, and wherein the multi-vibrator generates vibrations and a visible alarm through the LED D8 indicating that there is at least one fault in the leakage current protection device when the fault alarm circuit receives a positive DC voltage.

6. The apparatus of claim 5, wherein the fault alarm circuit comprises an audio alarm circuit for generating an audible alarm.

7. The apparatus of claim 1, wherein the ground fault simulation unit comprises:
(i) a first resistor R1 having a first terminal and a second terminal;
(ii) a second resistor R2 having a first terminal and a second terminal;
(iii) a third resistor R3 having a first terminal and a second terminal;
(iv) a seventh diode D7 having a cathode and an anode, wherein the anode of the seventh diode D7 is connected to the input that is electrically coupled a hot wire of the AC power, and the cathode of the seventh diode D7 is connected to both the first terminal of the resistor R1 and the first terminal of the second resistor R2;
(iv) a first transistor Q1 having a first collector electrically coupled to the second terminal of the first resistor R1, a first emitter electrically coupled to both the second terminal of the third resistor R3 and the output, and a first base; and
(iii) a sixth zener diode D6 having an anode electrically coupled to the base of the first transistor Q1, and a cathode electrically coupled to both the second terminal of the second resistor R2 and the first terminal of the third resistor R3.

8. The apparatus of claim 1, wherein the ground fault simulation unit comprises:
(i) a first resistor R1 having a first terminal and a second terminal;
(ii) a second resistor R2 having a first terminal and a second terminal;
(iii) a third resistor R3 having a first terminal and a second terminal electrically coupled to the second output2;
(iv) a seventh diode D7 having an anode electrically coupled to the input of the ground fault simulation unit, and a cathode electrically coupled to both the first terminal of the first resistor R1 and the first terminal of the second resistor R2;
(v) a first transistor Q1 having a first collector electrically coupled to the second terminal of the first resistor R1, a first emitter electrically coupled to the second input of the leakage current protection device, and a base; and
(iv) a sixth zener diode D6 having an anode electrically coupled to the base of the first transistor Q1, and a cathode electrically coupled to both the second terminal of the second resistor R2 and the first terminal of the third resistor R3.

9. The apparatus of claim 1, wherein the ground fault simulation unit comprises:
(i) a first resistor R1 having a first terminal and a second terminal;
(ii) a seventh diode D7 having an anode electrically coupled to the input, and a cathode electrically coupled to the first terminal of the resistor R1; and
(ii) a transformer T1 having a primary winding having a first primary terminal P1 and a second primary terminal P2, and a secondary winding having a first secondary terminal S1 and a second secondary terminal S2, wherein the first primary terminal P1 is electrically coupled to the second terminal of the first resistor R1, the second primary terminal P2 is electrically coupled to the second input of the leakage current protection device, the first secondary terminal S1 is electrically coupled to the second secondary terminal S2 through the first inductive coil N1 and the second inductive coil N2.

10. The apparatus of claim 1, wherein the ground fault simulation unit comprises:
(i) a seventh diode D7 having a cathode and an anode electrically coupled to the input; and
(ii) a first resistor R1 having a first terminal electrically coupled to the cathode of the seventh diode D7, and a second terminal electrically coupled to the output.

11. The apparatus of claim 1, wherein the ground fault simulation unit comprises:
(i) a first resistor R1 having a first terminal and second terminal;
(ii) a seventh diode D7 having an anode electrically coupled to the input, and a cathode electrically coupled to the first terminal of the first resistor R1; and
(iii) a sixth zener diode D6 having a cathode electrically coupled to the second terminal of the first resistor R1, and an anode electrically coupled to the output.

12. A method for intelligently testing the life of a leakage current protection device, wherein the leakage current protection device has a first inductive coil N1, a second inductive coil N2, a first input, a second input, a first output electrically coupled to the second input through the first inductive coil N1 and the second inductive coil N2, a second output, a third output, a trip switch SW101 having two LINE terminals and electrically coupled to the first input and the second input, respectively, for receiving an AC power, and two LOAD terminals and electrically coupled to the inputs of an electrical appliance, respectively, a power supply circuit having an input electrically coupled to the first input, and an output electrically coupled to the second output, a trip coil circuit having a switching device VD1 having a gate, an anode and a cathode, an input, an output electrically coupled to the third output, and a leakage current detection circuit having an output electrically coupled to the input of the trip coil circuit, and a power supply inputp electrically coupled to the output of the power supply circuit and the second output, comprising the steps of:
  (i) providing a testing device having:
    (a) a trip mechanism state generator having a first input electrically coupled to the third output of the leakage current protection device, a second input electrically coupled to the first input of the leakage current protection device, a third input electrically coupled to the second input of the leakage current protection device, a first output and a second output, wherein the trip mechanism state generator is adapted for generating a trip mechanism state at the first output and the second output, wherein the trip mechanism state has a first state and a second state, and wherein when the trip mechanism state is in the first state, there is no fault exist in the leakage current protection device, and wherein the trip mechanism state is in the second state, there is at least one fault exists in the leakage current protection device;
    (b) a fault alarm generator having a first input electrically coupled to the first output of the trip mechanism state generator, a second input electrically coupled to the second output of the trip mechanism state generator, and a power supply input electrically coupled to the second output of the leakage current protection device; and
    (c) a ground fault simulation unit having an input electrically coupled to the first input of the leakage current protection device, and an output electrically coupled to the first output of the leakage current protection device,
  (ii) generating a simulated ground fault signal during every positive half-wave of the AC power by the ground fault simulation unit;
  (iii) detecting the simulated ground fault signal at the leakage current detection circuit;
  (iv) generating a signal to turn the switching device VD1 into its conductive state so as to allow a current to pass therethrough;
  (v) generating a DC voltage in responsive to a trip mechanism state at the trip mechanism state generator, wherein the trip mechanism state is in a first state that there is no fault exist in the leakage current protection device, or in a second state that there is at least one fault exists in the leakage current protection device;
  (vi) receiving the DC voltage at the fault alarm circuit; and
  (vii) indicating whether at least one fault exists in the leakage current protection device.

13. The method of claim 12, wherein the indicating step comprises the step of producing a visible alarm.

14. The method of claim 13, wherein the indicating step further comprises the step of producing an audible alarm.

15. A leakage current protection device with intelligent life testing, comprising:
  (I) a leakage current protection device having:
    (a) a first inductive coil N1;
    (b) a second inductive coil N2;
    (c) a first input;
    (d) a second input;
    (e) a first output electrically coupled to the second input through the first inductive coil N1 and the second inductive coil N2;
    (f) a second output;
    (g) a third output;
    (h) a trip switch SW101 having two LINE terminals and electrically coupled to the first input and the second input, respectively, for receiving an AC power, and two LOAD terminals and electrically coupled to the inputs of an electrical appliance, respectively;
    (i) a power supply circuit having an input electrically coupled to the first input, and an output electrically coupled to the second output;
    (j) a trip coil circuit having a switching device VD1 having a gate, an anode and a cathode, an input, and an output electrically coupled to the third output; and
    (k) a leakage current detection circuit having an output electrically coupled to the input of the trip coil circuit, and a power supply inputp electrically coupled to the output of the power supply circuit and the second output;
  (II) a trip mechanism state generator having a first input electrically coupled to the third output of the leakage current protection device, a second input electrically coupled to the first input of the leakage current protection device, a third input electrically coupled to the second input of the leakage current protection device, a first output and a second output, wherein the trip mechanism state generator is adapted for generating a trip mechanism state at the first output and the second output, wherein the trip mechanism state has a first state and a second state, and wherein when the trip mechanism state is in the first state, there is no fault exist in the leakage current protection device, and wherein the trip mechanism state is in the second state, there is at least one fault exists in the leakage current protection device;
  (III) a fault alarm generator having a first input electrically coupled to the first output of the trip mechanism state generator, a second input electrically coupled to the second output of the trip mechanism state generator, and a power supply input electrically coupled to the second output of the leakage current protection device; and
  (IV) a ground fault simulation unit having an input electrically coupled to the first input of the leakage current protection device, and an output electrically coupled to the first output of the leakage current protection device,
wherein, in operation, the ground fault simulation unit generates a simulated ground fault signal during every positive half-wave of the AC power, the simulated ground fault signal is detected by the leakage current detection circuit, the leakage current detection circuit responsively generates a signal to turn the switching device VD1 into its conductive state so as to allow a current to pass therethrough, the passed current is converted into a DC voltage in accordance with a trip mechanism state generated by the trip mechanism state generator, the fault alarm circuit receives and analyzes the DC voltage and indicates whether a fault exists in the leakage current protection device.

16. The leakage current protection device of claim 15, wherein the trip mechanism state generator comprises:
   (i) a first diode D1 having an anode electrically coupled to the second input of the trip mechanism state generator, and a cathode;
   (ii) a second diode D2 having a cathode electrically coupled to the cathode of the first diode D1 and the first input of the trip mechanism state generator, and an anode electrically coupled to the third input of the trip mechanism state generator;
   (iii) a third diode D3 having a cathode electrically coupled to the second input of the leakage current protection device and the anode of the second diode D2, and an anode;
   (iv) a fourth diode D4 having a cathode electrically coupled to the anode of the first diode D1 and the first input of the leakage current protection device, and an anode electrically coupled to a first output of the trip mechanism state generator;
   (v) a fifth resistor R5 having a first terminal electrically coupled to the first output of the trip mechanism state generator, and a second terminal electrically coupled to the second output; and
   (vi) a sixth resistor R6 having a first terminal electrically coupled to the second terminal of the fifth resistor R5 and the second output of the trip mechanism state generator, and a second terminal electrically coupled to the anode of the third diode D3.

17. The leakage current protection device of claim 16, the DC voltage is detected at the first terminal and the second terminal of the resistor R5.

18. The leakage current protection device of claim 17, wherein the DC voltage is a negative voltage if there is no fault in the leakage current protection device, and the DC voltage is a positive voltage if there is at least one fault in the leakage current protection device.

19. The leakage current protection device of claim 18, wherein the fault alarm circuit comprises a multi-vibrator having a light emitting diode (LED) D8, wherein the multi-vibrator generates no vibration indicating there is no fault in the leakage current protection device if the fault alarm circuit receives the negative DC voltage, and generates a vibration and a visible alarm through the LED D8 indicating there is at least one fault in the leakage current protection device if the fault alarm circuit receives the positive DC voltage.

20. The leakage current protection device of claim 19, wherein the fault alarm circuit comprises an audio alarm circuit for generating an audible alarm.

21. The leakage current protection device of claim 15, wherein the ground fault simulation unit comprises:
   (i) a first resistor R1 having a first terminal and a second terminal;
   (ii) a second resistor R2 having a first terminal and a second terminal;
   (iii) a third resistor R3 having a first terminal and a second terminal;
   (iv) a seventh diode D7 having a cathode and an anode, wherein the anode of the seventh diode D7 is connected to the input that is electrically coupled a hot wire of the AC power, and the cathode of the seventh diode D7 is connected to both the first terminal of the second resistor R1 and the first terminal of the second resistor R2;
   (iv) a first transistor Q1 having a first collector electrically coupled to the second terminal of the first resistor R1, a first emitter electrically coupled to both the second terminal of the third resistor R3 and the output, and a first base; and
   (iii) a sixth zener diode D6 having an anode electrically coupled to the base of the first transistor Q1, and a cathode electrically coupled to both the second terminal of the second resistor R2 and the first terminal of the third resistor R3.

22. The leakage current protection device of claim 15, wherein the ground fault simulation unit comprises:
   (i) a first resistor R1 having a first terminal and a second terminal;
   (ii) a second resistor R2 having a first terminal and a second terminal;
   (iii) a third resistor R3 having a first terminal and a second terminal electrically coupled to the second output2;
   (iv) a seventh diode D7 having an anode electrically coupled to the input of the ground fault simulation unit, and a cathode electrically coupled to both the first terminal of the first resistor R1 and the first terminal of the second resistor R2;
   (v) a first transistor Q1 having a first collector electrically coupled to the second terminal of the first resistor R1, a first emitter electrically coupled to the second input of the leakage current protection device, and a base; and
   (iv) a sixth zener diode D6 having an anode electrically coupled to the base of the first transistor Q1, and a cathode electrically coupled to both the second terminal of the second resistor R2 and the first terminal of the third resistor R3.

23. The leakage current protection device of claim 15, wherein the ground fault simulation unit comprises:
   (i) a first resistor R1 having a first terminal and a second terminal;
   (ii) a seventh diode D7 having an anode electrically coupled to the input, and a cathode electrically coupled to the first terminal of the resistor R1; and
   (ii) a transformer T1 having a primary winding having a first primary terminal P1 and a second primary terminal P2, and a secondary winding having a first secondary terminal S1 and a second secondary terminal S2, wherein the first primary terminal P1 is electrically coupled to the second terminal of the first resistor R1, the second primary terminal P2 is electrically coupled to the second input of the leakage current protection device, the first secondary terminal S1 is electrically coupled to the second secondary terminal S2 through the first inductive coil N1 and the second inductive coil N2.

24. The leakage current protection device of claim 15, wherein the ground fault simulation unit comprises:
   (i) a seventh diode D7 having a cathode and an anode electrically coupled to the input; and
   (ii) a first resistor R1 having a first terminal electrically coupled to the cathode of the seventh diode D7, and a second terminal electrically coupled to the output.

25. The leakage current protection device of claim 15, wherein the ground fault simulation unit comprises:
   (i) a first resistor R1 having a first terminal and second terminal;
   (ii) a seventh diode D7 having an anode electrically coupled to the input, and a cathode electrically coupled to the first terminal of the first resistor R1; and
   (iii) a sixth zener diode D6 having a cathode electrically coupled to the second terminal of the first resistor R1, and an anode electrically coupled to the output.

* * * * *